US006839139B2

(12) United States Patent
Chen et al.

(10) Patent No.: US 6,839,139 B2
(45) Date of Patent: Jan. 4, 2005

(54) BENCH BASED INTEGRATED WAVELENGTH LOCKER

(75) Inventors: Xiansong Chen, Charlotte, NC (US); Yinbao Yang, Charlotte, NC (US)

(73) Assignee: Digital Optics Corp., Charlotte, NC (US)

( * ) Notice: Subject to any disclaimer, the term of this patent is extended or adjusted under 35 U.S.C. 154(b) by 187 days.

(21) Appl. No.: 10/097,648

(22) Filed: Mar. 15, 2002

(65) Prior Publication Data

US 2003/0174331 A1 Sep. 18, 2003

(51) Int. Cl.⁷ ............................ G01N 21/25; H01S 3/13
(52) U.S. Cl. ...................................... 356/416; 372/32
(58) Field of Search ........................ 356/416; 250/226; 372/32

(56) References Cited

U.S. PATENT DOCUMENTS

| | | | | |
|---|---|---|---|---|
| 4,945,400 A | * | 7/1990 | Blonder et al. ............... | 385/15 |
| 5,854,867 A | * | 12/1998 | Lee et al. ..................... | 385/49 |
| 6,134,253 A | * | 10/2000 | Munks et al. ................. | 372/32 |
| 6,370,290 B1 | * | 4/2002 | Ball et al. ..................... | 385/14 |
| 6,671,296 B2 | * | 12/2003 | May ............................. | 372/20 |
| 2003/0161603 A1 | * | 8/2003 | Nadeau et al. .............. | 385/137 |
| 2004/0146077 A1 | * | 7/2004 | Kathman et al. ............ | 372/32 |

* cited by examiner

Primary Examiner—Zandra Smith
Assistant Examiner—Kara Geisel
(74) Attorney, Agent, or Firm—Susan S. Morse

(57) ABSTRACT

A wavelength monitor includes: a splitter on an optics block dividing an input beam into a first portion and a second portion; a first detector and a second detector; a wavelength selective element in an optical path of one of the first and second portions before a respective detector; and an optical bench on which the splitter, the first and second detectors, and the wavelength selective element are mounted. The optical bench may include a hole through which an application beam, separate from the first and second portions, is to pass. The optical bench may include a reflective surface below an active area of the detectors for directing the light onto the active areas.

31 Claims, 2 Drawing Sheets

BENCH BASED INTEGRATED WAVELENGTH LOCKER

BACKGROUND

1. Field of the Invention

The present invention is directed to an integrated wavelength monitor, more particularly to a wavelength monitor integrated on an optical bench.

2. Description of Related Art

Some radiation sources exhibit wavelength drift over time in excess of that tolerable for many applications. This drift becomes increasingly important as the lifetimes over which these radiation sources are to be deployed increases. Factors such as temperature, age, operating power level, etc., all affect the output wavelength. By monitoring at least one of the direction of the wavelength change, the degree of the change and the percentage of the light being radiated at the different wavelengths, any or all factors which may be causing this change can be modified in accordance with the monitored signal via a feedback loop to stabilize the wavelength of the radiation source. Preferably, both the power and the wavelength are monitored in accordance with known techniques.

Most current wavelength lockers are mounted on a carrier, e.g., a ceramic, to provide support for and connections to the detectors. These solutions include mounting discrete components on a carrier or vertically stacking lithographically formed components, such as set forth, for example, in commonly assigned, co-pending U.S. application Ser. No. 09/543,760 entitled "An Etalon, A Wavelength Monitor/Locker Using the Etalon and Associated Methods" filed Apr. 5, 2000 and U.S. application Ser. No. 09/994,869 entitled "Reduced Noise Wavelength Locker Module" filed Nov. 28, 2001, both of which are hereby incorporated in their entirety for all purposes. While the discrete component solution provides planar packaging, it is not scaleable. While the vertically stacked solution facilitates mass production, it is not a planar package, making it more difficult to handle in automation assembly.

Further, when bonding a glass optical element to a carrier may cause problems due to a mismatch of coefficient of thermal efficiency between these materials. Also, the electrical connections to the detectors on the carrier are realized using wire bonds, which may be too slow and require long leads. Finally, the thermal performance of the carrier is often poor.

SUMMARY OF THE INVENTION

The present invention is therefore directed to wavelength lockers which substantially overcome one or more of the problems due to the limitations and disadvantages of the related art.

At least one of the above and other objects may be realized by providing a wavelength monitor including a splitter on an optics block dividing an input beam into a first portion and a second portion, a first detector and a second detector, a wavelength selective element in an optical path of one of the first and second portions before a respective detector, and an optical bench on which the splitter, the first and second detectors and the wavelength selective element are mounted, the optical bench including a hole through which an application beam, separate form the first and second portions, is to pass.

The optical bench may be a silicon bench. The hole may be metalized and/or may be an etched groove. The wavelength monitor may include bonding pads for the first and second detectors on the optical bench. The first and second detectors may be flip-chip bonded to the optical bench.

The wavelength monitor may include a reflective surface directing first and second portions to their respective detectors. The reflective surface may be formed on a surface of the optical bench. The reflective surface may include a reflective coating on an etched surface of the optical bench. The reflective surface may be below a respective detector and directs light up onto the detector.

The wavelength monitor may include a mounting platform on the optical bench for the detectors which rise above a mounting level on the optical bench for the optical block. The wavelength selective element may be on the mounting level with the optical block. The mounting platform may extend at a same height along the optical bench. The hole may be in the mounting platform. The hole may be an etched groove in the mounting platform. The active regions of the first and second detectors may extend above the mounting platform to effectively detect the respective first and second portions. The optical bench may include a mounting area for a light source to be monitored. The mounting area may be at a same height as a mounting level of the optical bench for the optics block.

At least one of the above and other objects of the present invention may be realized by providing an optical bench including a mounting platform having an upper surface and an indent, wherein the upper surface is to receive a photodetector and a photosensitive portion of a photodetector is to face the indent, and a reflective surface below the upper surface, the reflective surface directing light incident thereon to the photosensitive portion of the photodetector.

The reflective surface may be in the indent, and may be in a surface of the indent. The indent may be a V-groove. The reflective surface may have a reflective coating. The optical bench may include a mount for a light source and/or a mount for optical elements directing light between the light source and the photodetector. The optical bench may include optical elements that direct only part of input light to the photodetector.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which.

DETAILED DESCRIPTION OF THE EMBODIMENTS

Figure 1A:
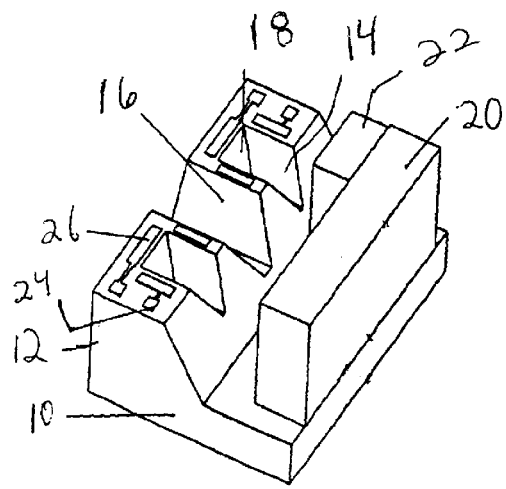
FIG. 1A is an elevational perspective view of a first embodiment of the integrated wavelength locker of the present invention using flip chip assembly.

The present invention will be described in detail through preferred embodiments with reference to accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Throughout the drawings, the same reference numerals denote the same elements.

FIG. 1A illustrates an embodiment of the wavelength monitor of the present invention, without the detectors yet mounted thereon. An optical bench 110 includes mounting platforms 12, turning V-grooves14 and a central V-groove 16. At least a back surface of the turning V-groove 14 is coated with a reflective coating, e.g., gold, to form a reflective surface 18. All surfaces of the turning V-groove 14 may be coated. The optical bench may be lithographically created by etching a substrate. The optical bench may be silicon, or some other material that may readily be etched and is thermally compatible with materials to be mounted thereon.

An optics block 20 is mounted on the optical bench 10. The optics block 20 is lithographically created on a wafer level, and includes a diffractive element to split an input beam. A wavelength selective element 22, e.g., a notch filter, an etalon, etc., is placed in the path to one of the turning V-grooves 14. Electrical input/output pads 24 and flip chip pads 26 are on the mounting platforms 12. The metal traces and solder pads on the mounting platforms 12 may be created using metal and/or solder deposition. The detectors, the optics block 20 and the wavelength selective element 22 may be mounted on the optical bench 20 using automated die bonding and pick-and-place equipment.

The central V-groove 16 provides an optical path for the application beam to pass through the bench 10 and helps to divide the detector channels to reduce interference therebetween. The central V-groove 16 may be metalized to assist in the latter function. If the bench 10 is transparent to wavelengths of interest, the central V-groove is not needed for the former function. However, elimination of this central V-groove would result in an offset between the input and output beam, would require an anti-reflective coating to reduce potential feedback, and would not separate the detector channels as effectively.

Figure 1B:
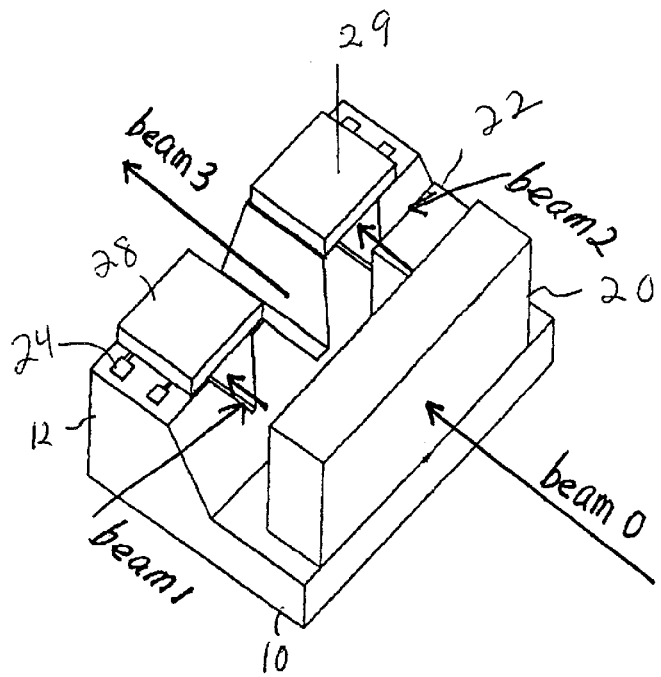
FIG. 1B is an elevational perspective view of the embodiment of FIG. 1A with detectors provided thereon.

The operation of the wavelength detector is shown in FIG. 1B. Here, detectors 28, 29 have been flip chip mounted on the mounting platforms 12. An input beam 0 is incident on the optics block 20. The optics block 20 outputs three beams. Beam 1 serves as a reference beam and is directed onto a reference detector 28 via the corresponding reflective surface 18. Beam 2 serves as a filter beam and is directed through the wavelength selective element 22 onto the filter detector 29 via the corresponding reflective surface 18. The outputs of the detectors 28, 29 may then be analyzed in a known manner. If the wavelength locker is to monitor an output from a light source which is to be further employed, beam 3 is a through beam passing through the V-groove 16. If the wavelength locker is to monitor a terminal beam, the pass through V-groove 16 may be eliminated or another mounting platform with a turning V-groove 14 and another detector.

Figure 1C:
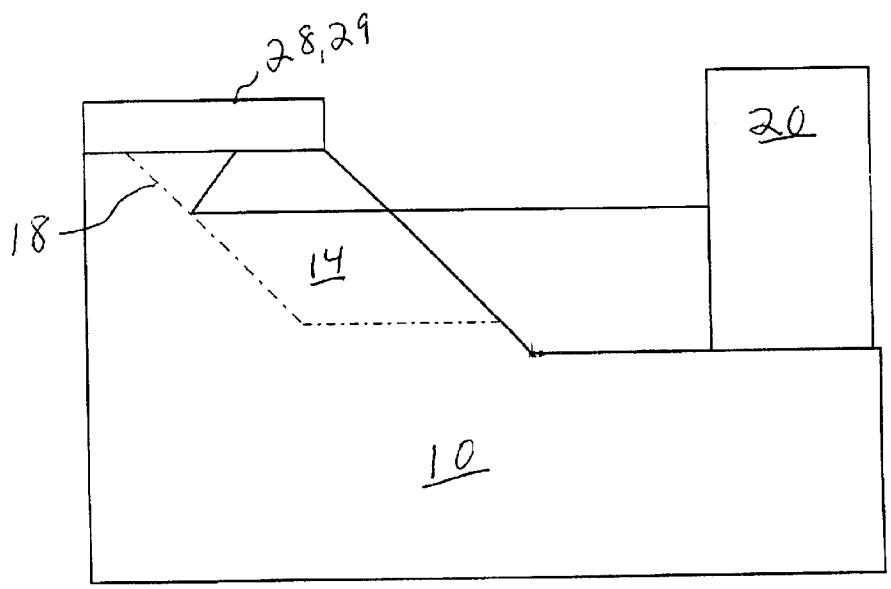
FIG. 1C is a schematic side view of the wavelength locker of FIG. 1B.

The side view of FIG. 1C illustrates the relationship between the reflective surface 18 and the detector 28, 29.

The light enters the turning V-groove 14 and hits the reflective surface 18, which then reflects the light onto the detector 28, 29. Thus, the turn required to interface a detector of the wavelength locker is achieved by optically turning the beam, rather than by using an electrical turn as in the related art embodiments.

Figure 2:
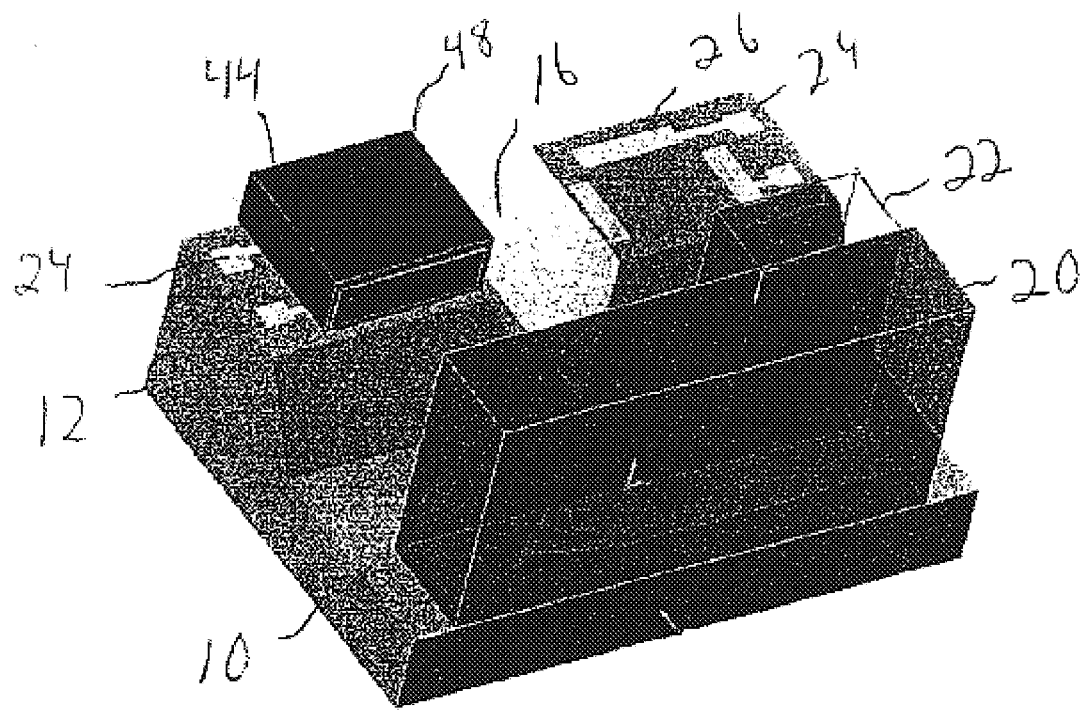
FIG. 2 is another embodiment of the integrated wavelength locker of the present invention using an edge detector.

FIG. 2 illustrates another embodiment of the wavelength locker of the present invention. As in the previous configuration, the wavelength locker includes the optics block 20 and the wavelength selective element 22 on the optical bench 10. Here, detectors 48, 49 (not shown, so that the flip chip bonding pads 26 may be viewed) are edge detectors which are flip chip mounted on mounting platforms 24 of the optical bench 10. Since the active regions 44 of the detectors are now already positioned to receive the light, there is no need for the turning V-grooves. However, a pass through V-groove 16 may still be required if the beam is not terminating at the wavelength locker. This configuration has the ease of assembly and attaching of the detectors 48, 49 of the first embodiment and the optical bench for this embodiment is simpler to process. However, edge detectors are currently not as readily available as surface detectors and are more expensive.

Figure 3:
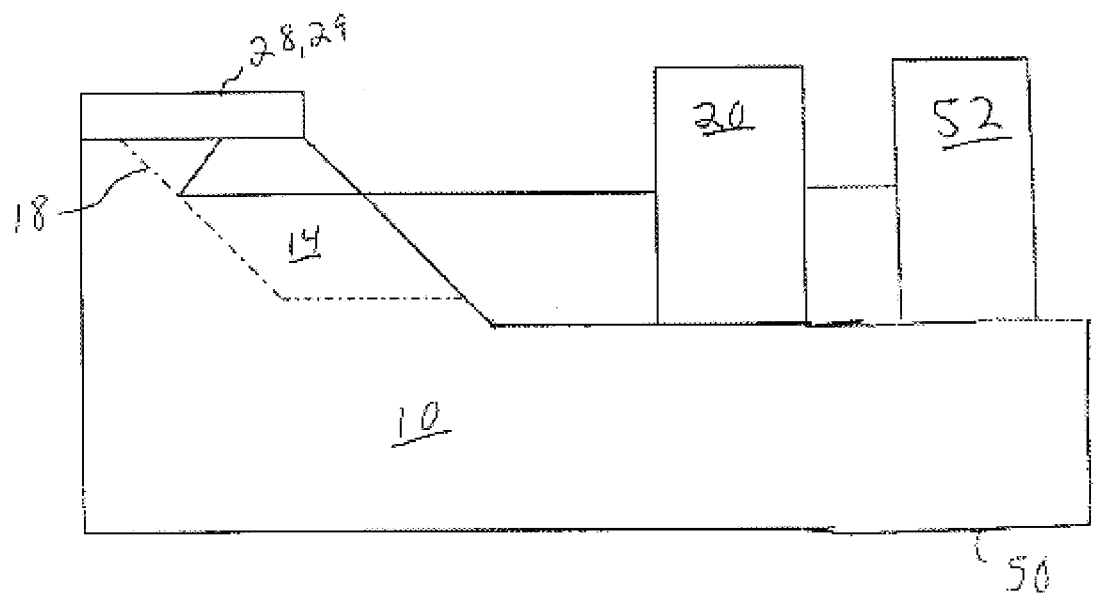
FIG. 3 is a schematic side view of a bench including the wavelength locker and the light source to be monitored.
Figure 1A:
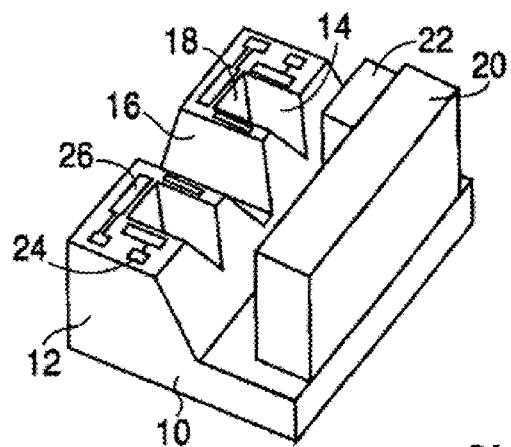
Figure 1B:
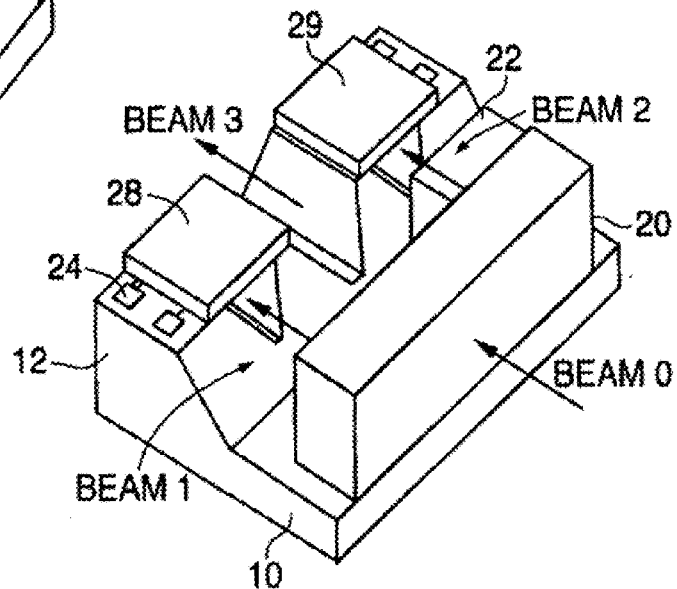
Figure 1C:
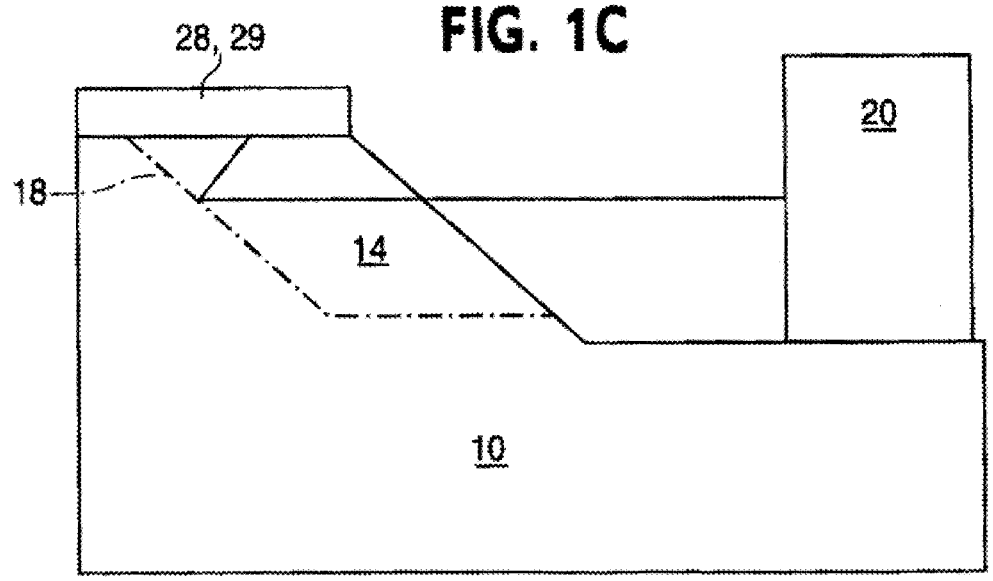
Figure 2:
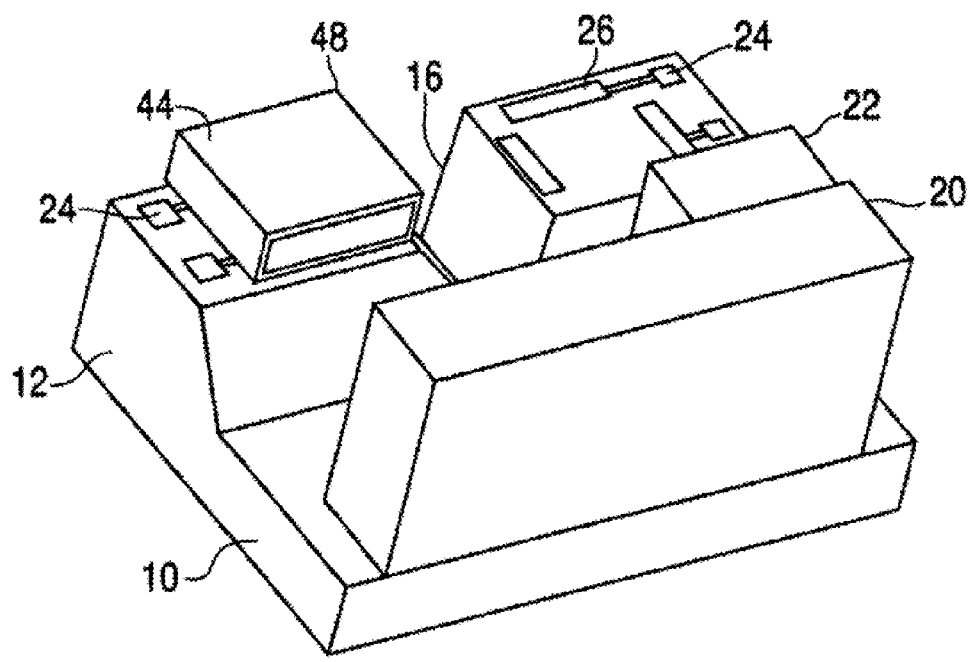
Figure 3:
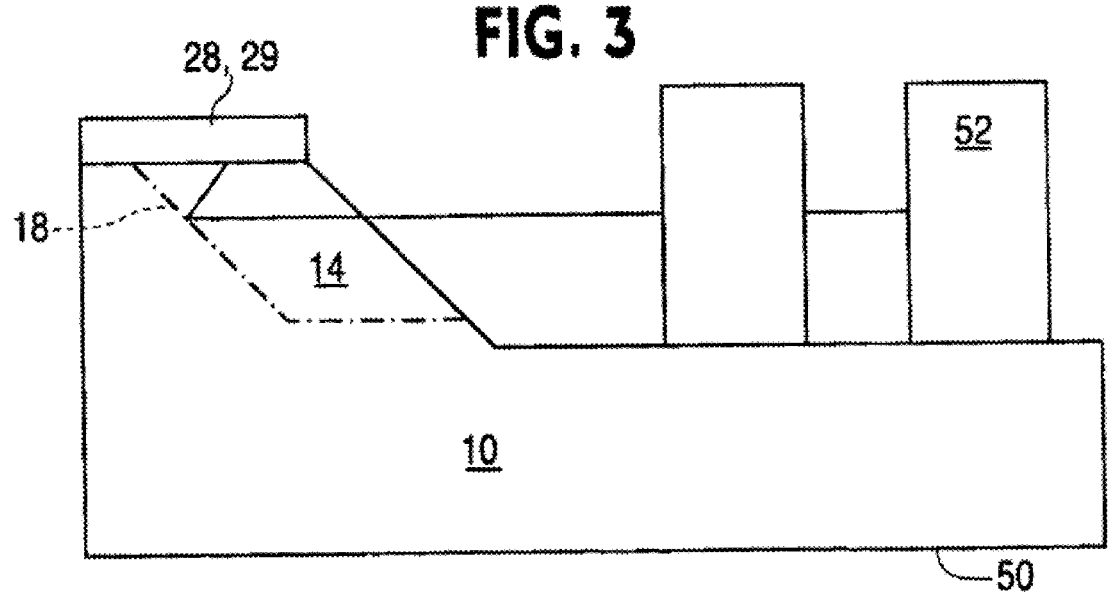

As shown in FIG. 3, the optical bench 10 may be extended to include a light source mount 50 for mounting a light source 52 to be monitored by the wavelength locker. While this modification is illustrated in conjunction with the first embodiment, it can be used with any of the above embodiments. This will facilitate the alignment of the wavelength locker to the light source.

While the detectors of all the embodiments are shown with a single active area, the filter detector may be segmented, e.g. a quadrature detector, and the wavelength selective filter may output different signals to these segmented regions. Further, a thermoelectric cooler for the wavelength selective filter and/or the light source may be provided on the optical bench 10.

While the present invention is described herein with reference to illustrative embodiments for particular applications, it should be understood that the present invention is not limited thereto. For example, other optical elements may be created on the optics block 20, e.g., for focusing and/or collimating any of the reference beam, the filter beam and the through beam. Alternatively or additionally, another optics block having other optical elements may be mounted on the optical bench. Those having ordinary skill in the art and access to the teachings provided herein will recognize additional modifications, applications, and embodiments within the scope thereof and additional fields in which the invention would be of significant utility without undue experimentation. Thus, the scope of the invention should be determined by the appended claims and their legal equivalents, rather than by the examples given.

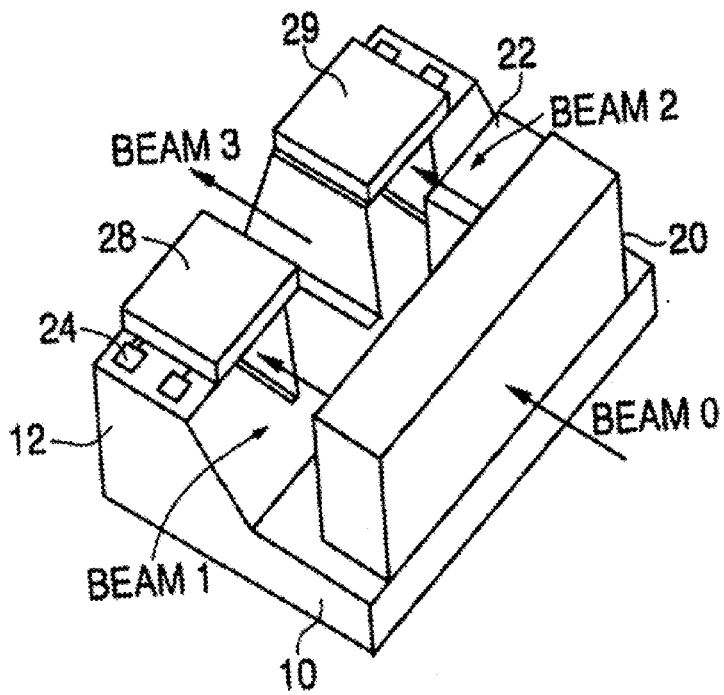

What is claimed is:

1. A wavelength monitor comprising:
   a splitter on an optics block dividing an input beam into a first portion and a second portion;
   a first detector and a second detector;
   a wavelength selective element in an optical path of one of the first and second portions before a respective detector; and
   an optical bench on which the splitter, the first and second detectors, and the wavelength selective element are mounted, the optical bench including a hole between the first and second detectors through which an application beam, separate from the first and second portions, is to pass.

2. The wavelength monitor of claim 1, wherein the optical bench is a silicon bench.

3. The wavelength monitor of claim 1, wherein the hole is metalized.

4. The wavelength monitor of claim 1, wherein the hole is an etched groove.

5. The wavelength monitor of claim 1, further comprising bonding pads for the first and second detectors on the optical bench.

6. The wavelength monitor of claim 1, wherein the first and second detectors are flip-chip bonded to the optical bench.

7. The wavelength monitor of claim 1, further comprising a reflective surface directing the first and second portions to their respective detectors.

8. The wavelength monitor of claim 7, wherein the reflective surface is formed on a surface of the optical bench.

9. The wavelength monitor of claim 8, wherein the reflective surface includes a reflective coating on an etched surface of the optical bench.

10. The wavelength monitor of claim 7, wherein the reflective surface is below a respective detector and directs light up onto the detector.

11. The wavelength monitor of claim 1, wherein the detectors are edge detectors.

12. The wavelength monitor of claim 1, further comprising a mounting platform on the optical bench for the detectors which rise above a mounting level on the optical bench for the optics block.

13. The wavelength monitor of claim 12, wherein the wavelength selective filter is on the mounting level with the optics block.

14. The wavelength monitor of claim 12, wherein the mounting platform extends at a same height along the optical bench.

15. The wavelength monitor of claim 14, wherein the hole is in the mounting platform.

16. The wavelength monitor of claim 14, wherein the hole is an etched groove in the mounting platform.

17. The wavelength monitor of claim 12, further comprising a reflective surface in the mounting platform below the detectors.

18. The wavelength monitor of claim 1, wherein active regions of the first and second detectors extend above the mounting platform to effectively detect the respective first and second portions.

19. The wavelength monitor of claim 1, wherein the optical bench further comprises a mounting area for a light source to be monitored.

20. The wavelength monitor of claim 19, wherein the mounting area is at a same height as a mounting level of the optical bench for the optics block.

21. The wavelength monitor of claim 1, wherein the optics block further comprises an optical element on a surface thereof for at least one of the first portion, the second portion and the application beam.

22. The wavelength monitor of claim 21, wherein the optical element provides at least one of focusing and collimating.

23. An optical bench comprising:
    a mounting platform having an upper surface and an indent, wherein the upper surface is to receive a photodetector and a photosensitive portion of the photodetector is to face the indent, the mounting platform including a hole, adjacent to the indent, through which light to be output from the optical bench passes; and
    a reflective surface below the upper surface, the reflective surface directing light incident hteroen to the photosensitive portion of the photodetector.

24. The optical bench of claim 23, wherein the reflective surface is in the indent.

25. The optical bench of claim 23, wherein the reflective surface is in a surface of the indent.

26. The optical bench of claim 23, wherein the indent is a V-groove.

27. The optical bench of claim 23, wherein the reflective surface has a reflective coating.

28. The optical bench of claim 23, further comprising a mount for a light source.

29. The optical bench of claim 28, further comprising a mount for optical elements directing light between the light source and the photodetector.

30. The optical bench of claim 23, further comprising optical elements that direct only part of input light to the photodetector.

31. A wavelength monitor comprising:
    a beam on an optics block dividing an input beam into a first portion and a second portion;
    a first edge detector and a second edge detector;
    a wavelength selective element in an optical path of one of the first and second portions before a respective detector; and
    an optical bench on which the splitter, the first and second detectors, and the wavelength selective element are mounted, the optical bench including a hole through which an application beam, separate from the first and second portions, is to pass.

* * * * *

UNITED STATES PATENT AND TRADEMARK OFFICE
CERTIFICATE OF CORRECTION

PATENT NO. : 6,839,139 B2          Page 1 of 4
APPLICATION NO. : 10/097648
DATED : January 4, 2005
INVENTOR(S) : Chen et al.

It is certified that error appears in the above-identified patent and that said Letters Patent is hereby corrected as shown below:

Delete Title page illustrating a figure, and substitute therefor, new Title page illustrating a figure. (attached)

Delete drawing sheets 1 & 2, and substitute therefor drawing sheets 1 & 2. (attached)

Signed and Sealed this

Twenty-third Day of September, 2008

JON W. DUDAS
*Director of the United States Patent and Trademark Office*

(12) United States Patent
Chen et al.

(10) Patent No.: US 6,839,139 B2
(45) Date of Patent: Jan. 4, 2005

(54) BENCH BASED INTEGRATED WAVELENGTH LOCKER

(75) Inventors: Xiansong Chen, Charlotte, NC (US); Yinbao Yang, Charlotte, NC (US)

(73) Assignee: Digital Optics Corp., Charlotte, NC (US)

(*) Notice: Subject to any disclaimer, the term of this patent is extended or adjusted under 35 U.S.C. 154(b) by 187 days.

(21) Appl. No.: 10/097,648

(22) Filed: Mar. 15, 2002

(65) Prior Publication Data
US 2003/0174331 A1 Sep. 18, 2003

(51) Int. Cl.[7] ............... G01N 21/25; H01S 3/13
(52) U.S. Cl. ....................... 356/416; 372/32
(58) Field of Search ................ 356/416; 250/226; 372/32

(56) References Cited

U.S. PATENT DOCUMENTS

| | | | |
|---|---|---|---|
| 4,945,400 A | * 7/1990 | Blonder et al. | 385/15 |
| 5,854,867 A | * 12/1998 | Lee et al. | 385/49 |
| 6,134,253 A | * 10/2000 | Munks et al. | 372/32 |
| 6,370,290 B1 | * 4/2002 | Ball et al. | 385/14 |
| 6,671,296 B2 | * 12/2003 | May | 372/20 |
| 2003/0161603 A1 | * 8/2003 | Nadeau et al. | 385/137 |
| 2004/0146077 A1 | * 7/2004 | Kathman et al. | 372/32 |

\* cited by examiner

Primary Examiner—Zandra Smith
Assistant Examiner—Kara Geisel
(74) Attorney, Agent, or Firm—Susan S. Morse

(57) ABSTRACT

A wavelength monitor includes: a splitter on an optics block dividing an input beam into a first portion and a second portion; a first detector and a second detector; a wavelength selective element in an optical path of one of the first and second portions before a respective detector; and an optical bench on which the splitter, the first and second detectors, and the wavelength selective element are mounted. The optical bench may include a hole through which an application beam, separate from the first and second portions, is to pass. The optical bench may include a reflective surface below an active area of the detectors for directing the light onto the active areas.

31 Claims, 2 Drawing Sheets